United States Patent [19]

Davies et al.

[11] Patent Number: 5,265,064
[45] Date of Patent: Nov. 23, 1993

[54] PULSE GENERATOR CIRCUIT ARRANGEMENT

[75] Inventors: Thomas J. Davies, Eindhoven; Leonardus C. M. G. Pfennings, deceased, late of Sittard; Henricus J. Kunnen, legal representative, Valkenswaard; Peter H. Voss, Eindhoven; Cormac O'Connell, Eindhoven; Cathal G. Phelan, Eindhoven; Hans Ontrop, Eindhoven, all of Netherlands

[73] Assignee: U.S. Philips Corp., New York, N.Y.

[21] Appl. No.: 449,666

[22] Filed: Dec. 12, 1989

[30] Foreign Application Priority Data

Dec. 14, 1988 [GB] United Kingdom ............... 8829154

[51] Int. Cl.⁵ .................................. G11C 8/00
[52] U.S. Cl. .................. 365/233.5; 365/194; 365/195; 365/196; 365/203; 307/265; 307/480; 307/481
[58] Field of Search ............ 365/203, 233.5, 195, 365/196, 194; 307/480, 481, 265

[56] References Cited

U.S. PATENT DOCUMENTS

| | | | |
|---|---|---|---|
| 4,733,377 | 3/1988 | Aoyama et al. | 365/233.5 |
| 4,751,680 | 6/1988 | Wang et al. | 365/203 |
| 4,843,596 | 6/1989 | Miyatake et al. | 365/233.5 |
| 4,947,374 | 8/1990 | Wada et al. | 365/233.5 |

FOREIGN PATENT DOCUMENTS 1372183 10/1974 United Kingdom .

OTHER PUBLICATIONS

S. Kayano et al., "25-ns 256K×1/64K×4 CMOS SRAM's", IEEE J. of S.-S. Ckts., vol. SC-21, #5, Oct. 1986, pp. 686-690.
"One CMOS Quad Latch Yields Four One-Shots", M. Blair, EDN, vol. 23, No. 7, pp. 122, 124, Apr. 5, 1978.

Primary Examiner—Joseph E. Clawson, Jr.
Attorney, Agent, or Firm—Steven R. Biren

[57] ABSTRACT

A circuit which responds to the application of a pulse to its input (6) by generating a pulse at its output (3), the output pulse having a minimum duration T and being extended by the remaining length of the input pulse should the input pulse be still present at the end of the time T, comprises a pair of semiconductor switches (1,2) connecting the output (3) to points (5,4) carrying respective logic levels. The input pulse closes the first switch (1) and also inhibits a gate circuit (9). The resulting logic level on the output (3) closes the second switch (2) after delay by T in a delay circuit (13) and transmission through the gate circuit (9), thereby restoring the original logic level. The instant when this occurs coincides with the presence of the delayed output pulse at the output (14) of the delay circuit and the absence of the pulse at the arrangement input (6). A hold circuit circuit (15) may be provided for holding the logic level currently present at the output (3). The circuit may be used as an equalisation pulse generator for a data path in a semiconductor memory integrated circuit.

6 Claims, 2 Drawing Sheets

PULSE GENERATOR CIRCUIT ARRANGEMENT

BACKGROUND OF THE INVENTION

This invention relates to a pulse generator circuit arrangement which is triggerable to generate an output pulse of minimum duration T by a transition of a signal at an input thereof from a first to a second logic level. The invention also relates to a memory arrangement including such a pulse generator arrangement.

Some known such pulse generator arrangements take the form of retriggerable monostable multivibrators or "one-shots". If these are supplied with a single input pulse an output pulse of duration T (often defined by the time constant of an RC circuit) is produced. If a single further input pulse is supplied to the arrangement white the output pulse is present, the duration of the output pulse is extended so that it now terminates at substantially a time T after the leading edge of the further input pulse. The output pulse can be extended further in an analogous manner if yet further input pulses are supplied to the arrangement input white the output pulse is still present. The known arrangements tend to be rather complicated, and hence occupy a relatively large area of semiconductor surface if they are constructed in integrated circuit form.

In semiconductor memory integrated circuits the data paths are often of the differential type, the data bit carried by such a path at any given time being indicated by the sense of the difference between the potentials on a pair of conductors which together form the path. Prior to the application of a data bit to such a path, for example from an accessed memory cell, it is known to equalise the potentials on the two conductors by temporarily effectively connecting them together, in order to prevent any difference in potential already present from masking the required data bit when it is subsequently impressed on the path. Obviously such equalisation is only required when a new cell is accessed and, to this end, it is known to provide a so-called address transition detector circuit corresponding to each address bit input of the integrated circuit, this detector producing an output pulse each time the corresponding address bit changes, and initiating the equalisation function. The use of such address transition detectors is described, for example, in an article entitled "A 40-ns/100-pF low-Power Full-CMOS 256K (32K×8) SRAM" by Gubbels et al. in IEEE Journal of Solid-State Circuits, Vol. SC-22, No. 5, October 1987, pages 741-747. In this known memory the output signals of the address transition detectors are combined by means of a wired-OR and trigger an equalization pulse generator each time a change of address occurs. The resulting pulse from the generator in turn controls the equalization function, inter alia by controlling conduction in a transistor connected between the conductors of the data path. The duration of each pulse can be chosen so that each conduction period is sufficiently long for satisfactory equalization to be obtained, termination thereof allowing data to be impressed on the path. However, it is often the case that address bits do not change simultaneously, but rather in a skewed manner. If the duration of each equalization pulse were fixed then, if this duration were comparatively short, it could be that it would terminate before the address had settled, with the result that data from an incorrect memory location would be liable to be impressed on the path. On the other hand, if this duration were long enough to embrace the worst possible skewing of an address change many memory location accessing operations would take longer than they inherently need. Of course, the equalization pulse generator could take the form of a conventional retriggerable monostable multivibrator but, as pointed out above, these tend to be rather complicated. Moreover, in such a case each equalization pulse would terminate a time T after the last address bit to change has changed, where T has to be sufficiently long for satisfactory equalization to take place even if all the changing address bits were to change simultaneously. This again would be liable to result in many memory accessing operations taking longer than they inherently need.

SUMMARY OF THE INVENTION

According to one aspect the invention provides a pulse generator circuit arrangement which is triggerable to generate an output pulse of minimum duration T by a transition of a signal at an input thereof from a first to a second logic level, the arrangement being constructed so that, should said second logic level be present at said input on the expiry of the duration T, the output pulse is extended to terminate in synchronism with any subsequent transition of the input signal to the first logic level.

According to another aspect the invention provides a pulse generator circuit arrangement which is triggerable to generate an output pulse of minimum duration T by a transition of a signal at any of a plurality of inputs thereof from a first to a second logic level should that transition occur in the absence of a said output pulse, the arrangement being constructed so that, should said second logic level be present at any said input on the expiry of the duration T, the output pulse is extended to terminate in synchronism with any subsequent transition of the signal at any said input to the first logic level provided that that transition results in the second logic level ceasing to be present at any said input.

It has now been recognized that, if the end of an output pulse of a generator arrangement of the kind specified in the first paragraph is arranged to be related to the end of an input pulse rather than the beginning thereof when the pulse has a duration greater than T, as may be allowable in some applications, the arrangement can be implemented in a relatively simple manner. Moreover, such an arrangement can be employed to advantage as, inter alia, an equalization pulse generator in a memory arrangement.

BRIEF DESCRIPTION OF THE DRAWINGS

Embodiments of the invention will now be described, by way of example, with reference to the accompanying diagrammatic drawings in which.

DETAILED DESCRIPTION OF THE PREFERRED EMBODIMENTS

Figure 1:
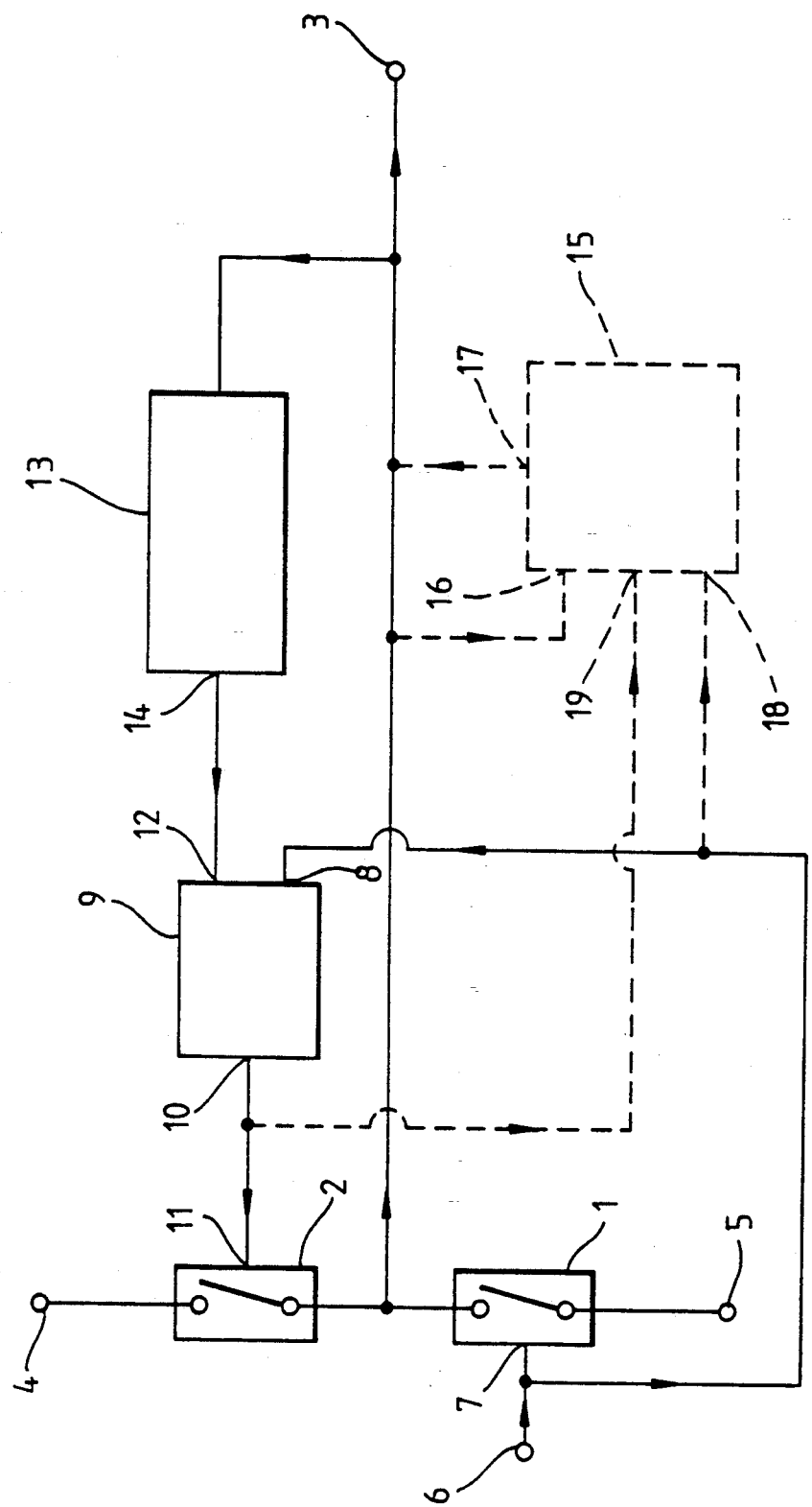
FIG. 1 is a block diagram of a first embodiment.

In FIG. 1 a pulse generator circuit arrangement which is triggerable to generate a pulse at an output 3 by a transition of a signal at an input 6 from a first to a second logic level, the output pulse having a minimum duration T and, should the second logic level be present at the input 6 on the expiry of the duration T, being extended to terminate in synchronism with any subsequent transition of the input signal to the first logic level, comprises first and second controllable switch means 1 and 2 respectively included between the output 3 and first and second supply points 5 and 4 respectively.

The input 6 of the arrangement is coupled to the control input 7 of the switch means 1 so that switch means 1 adopts its closed state when the second logic level is present at input 6, and adopts its open state when the first logic level is present at input 6. Thus when the second logic level is present at input 6 the output 3 is brought to the potential or logic level present at point 5. The input 6 is also coupled to a first input 8 of signal transmission inhibit means in the form of a gate circuit 9 the output 10 of which is coupled to the control input 11 of switch means 2. Gate circuit 9 is constructed to respond to the simultaneous presence of specific logic levels at its input 8 and a further input 12 by generating a specific logic level at its output 10, and to generate the other logic level at its output 10 otherwise. Switch means 2 responds to the presence of the specific logic level at output 10 by adopting its closed state, its open state being adopted otherwise. Output 3 is coupled to the input 12 of gate 9 via delay means in the form of a delay circuit 13 which delays signals appearing at output 3 by a time T before applying them to input 12.

The portion of the arrangement of FIG. 1 described so far operates as follows, it being assumed for illustration that the presence of logic "0" and logic "1" at the control input 7 of switch 1 control switch 1 to the open and closed states respectively, the presence of logic "0" and logic "1" at the control input 11 of switch 2 control switch 2 to its closed and open states respectively, gate circuit 9 generates logic "0" at its output 10 when logic "0" levels are simultaneously present at both its inputs 8 and 12 and generates logic "1" otherwise, and the potentials at points 4 and 5 correspond to logic "1" and logic "0" respectively. If output 3 is initially logic "1", switch means 2 is open and a logic "1" pulse is applied to input 6, switch means 1 closes and stays closed while the input pulse is present, pulling output 3 to the potential at point 5, i.e. logic "0". This logic "0" starts to propagate through the delay circuit 13. If the logic "1" pulse at input 6 ends before the propagating logic "0" reaches the output 14 of delay circuit 13, i.e. if the logic "1" pulse has a duration less than T, then although switch means 1 opens once again switch means 2 remains open for the time being; the logic level at input 12 of gate circuit 9 is still logic "1" so gate circuit 9 continues to produce logic "1" at its output 10. The arrangement output 3 therefore in principle floats, which can be satisfactory in some cases if its capacitance to ground is sufficient to maintain the potential thereat at logic "0". When the logic "0" propagating through delay circuit 13 eventually reaches the input 12, i.e. a time T after the start of the logic "1" pulse at input 6, both inputs of gate circuit 9 become logic "0", with the result that gate circuit 9 produces logic "0" at its output 10, closing switch 2 and thereby pulling output 3 to the potential at point 4, i.e. to logic "1". The net result is therefore that a logic "0" pulse of duration T has been produced at the arrangement output 3. If on the other hand the logic "0" pulse propagating through delay circuit 13 reaches its output 14 before the end of the logic "1" pulse at input 6, i.e. if this logic "1" pulse has a duration longer than T, then initially the states of the switches 1 and 2 and hence the potential at the arrangement output 3 remains unchanged; the potential at the input 8 of gate circuit 9 is still logic "1" so gate circuit 9 continues to produce logic "1" at its output 10; input 8 effectively constitutes an inhibit signal input of gate circuit 9, a logic "1" thereon inhibiting transmission of the output pulse of delay circuit 13 to output 10. When eventually the logic "1" pulse at input 6 ends, both inputs of gate circuit 9 become logic "0" so that switch 2 is closed, pulling output 3 to logic "1". Thus in this case a logic "0" pulse having a duration equal to that of the logic "1" pulse at input 6 is generated at the output 3. In both cases switch 2 eventually opens again at the end of the pulse propagated through delay circuit 13, so that output 3 in principle again floats which, as mentioned above, can be satisfactory in some circumstances.

If floating of the output 3 is undesirable the components shown in dashed lines in FIG. 1 may be also provided. These components comprise a hold circuit 15 having an input 16 and an output 17 both connected to the output 3, and disable control signal inputs 18 and 19 connected to the arrangement input 6 and the output 19 of gate circuit 9 respectively. Hold circuit 15 is constructed and arranged to hold any logic level currently present at the arrangement output 3 when both switches 1 and 2 are open, and to be disabled from holding the currently present logic level when either of the switches 1 and 2 are closed to pull the output 3 to the other logic level. Thus it is disabled from holding logic "1" when switch 1 is closed (corresponding to the application of logic "1" to control input 18) and is disabled from holding logic "0" when switch 2 is closed (corresponding to the application of logic "0" to control input 19). A possible construction for hold circuit 15 will be described with reference to FIG. 2.

Figure 2:
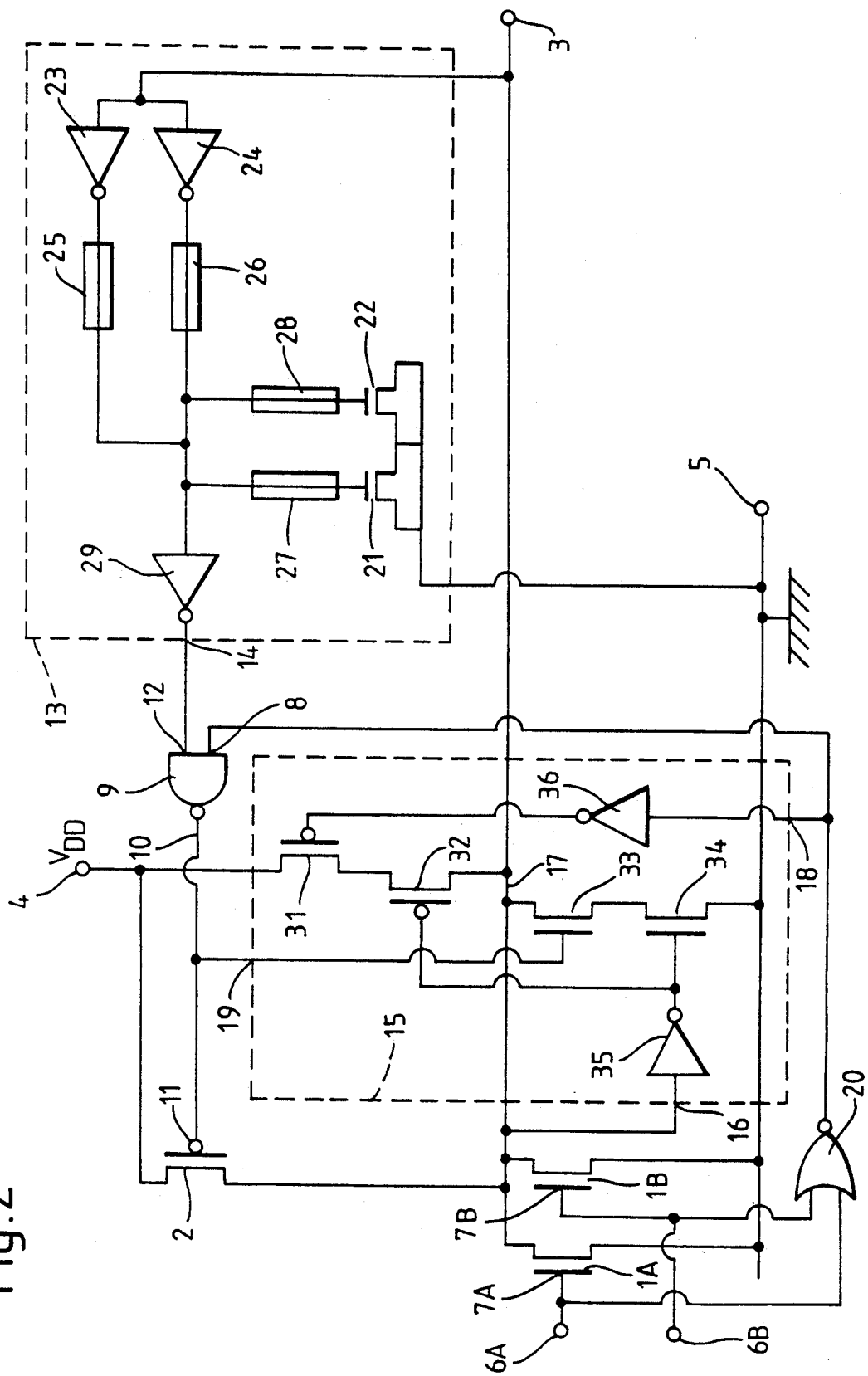
FIG. 2 is a more detailed circuit diagram of a second embodiment.

FIG. 2 is the circuit diagram of a slightly modified version of the embodiment of FIG. 1, the modifications being that (a) the input 6 is now plural, as is the switch means 1, and a NOR gate is provided to derive the signal for application to the input 8 of gate circuit 9, (b) gate circuit 9 is implemented as a NAND gate, i.e. it generates logic "0" when both inputs are logic "1", and (c) the delay-producing coupling from output 3 to the input 12 of gate circuit 9 produces a logic inversion (similarly to the additional NOR gate). In FIG. 2 corresponding items have been given, where possible, corresponding references to their counterparts in FIG. 1.

In FIG. 2 the single input 6 of FIG. 1 has been replaced by a pair of inputs 6A and 6B which are connected to the control inputs 7A and 7B respectively of first controllable switch means 1A and 1B respectively which correspond to the inputs 6A and 6B respectively and replace the single first switch means 1 of FIG. 1. Each first switch means 1A and 1B is constituted by an n-channel insulated-gate field-effect transistor structure, the control inputs 7A and 7B being constituted by the (insulated) gates of these structures. The channels of the structures 1A and 1B are connected in parallel between the output 3 and the logic level supply point 5 (ground). The further switch means 2 is similarly constituted by a p-channel insulated-gate field-effect transistor structure the channel of which is connected between the output 3 and the logic level supply point 4 ($V_{DD}$). The inputs 6A and 6B are coupled to the inputs 8 of gate circuit 9 and 18 of hold circuit 15 via respective inputs and the output of a NOR gate 20.

Delay circuit 13 is essentially an RC integrator circuit the capacitive components of which are constituted by n-channel insulated-gate field-effect transistor structures 21 and 22 the channels of which are grounded and the gates of which constitute the non-grounded electrodes. The resistive components of the integrator circuit are constituted by the internal resistances of a pair of amplifiers or inverters 23 and 24 which couple the output 3 to the gates of the structures 21 and 22 via fusible links 25 and 26 respectively and 27 and 28 respectively. The common point of the links 25-28 is coupled to the output 14 of circuit 13 via a further inverter 29. The links 25-28 are provided so that the delay T produced by circuit 13 is programmable by fusing one of the links 25 and 26 and/or one of the links 27 and 28. Preferably the sizes and hence capacitances of the structures 21 and 22 are mutually different, as are the transistor structures and hence effective resistances which constitute the (CMOS) inverters 23 and 24. Hold circuit 15 comprises a pair of p-channel insulated-gate field-effect transistor structures or controllable switch means 31 and 32 having their channels connected in series between terminal 4 and output 3, and a pair of n-channel insulated-gate field-effect transistor structures or switch means 33 and 34 having their channels connected in series between terminal 5 and output 3, the common point of the structures 32 and 33 constituting the hold circuit output 17. The structures 32 and 34 in fact constitute a CMOS inverter and perform the holding function, their gates being fed from the hold circuit input 16 via a (CMOS) inverter 35. Thus, if it is assumed that structures 31 and 33 are conductive, if the potential at output 3 corresponds to logic "0" (approximately ground potential) structure 34 is conductive whereas structure 32 is cut off, so output 3 is held at logic "0". Conversely, if the potential at output 3 corresponds to logic "1" (approximately $V_{DD}$ potential) structure 32 is conductive whereas structure 34 is cut off, so output 3 is held at logic "1". The structures 31 and 33 serve to disable hold circuit 15 from holding specific logic levels under certain circumstances, more particularly when any of the structures 1A, 1B or 2 is controlled to its conductive state. Thus, when either of switches 1A and 1B is controlled to conduct to bring output 9 to logic "0", NOR gate 20 applies logic "0" to hold circuit input 18. This level is inverted by an inverter 36 and applied to the gate of transistor structure 31, cutting this structure off and negating the effect of the currently conductive transistor structure 32 which would otherwise attempt to hold output 3 at logic "1". Similarly, when NAND gate 9 generates logic "0" to render transistor structure 11 conductive to thereby bring output 3 to logic "1", this logic "0" is applied via hold circuit input 19 to the gate of transistor structure 33, cutting this structure off and negating the effect of the currently conductive transistor structure 34 which would otherwise attempt to hold output 3 at logic "0".

It will be evident that many modifications may be made to the embodiments described within the scope of the invention as defined by the claims. For example the number of inputs 7, together with corresponding transistors 1 and inputs to NOR gate 20 in the arrangement of FIG. 2 may be extended at will. The gates 9 and 20 and the inverters 23, 24, 27, 28, 35 and 36 of FIG. 2 may of course be constituted by conventional CMOS circuits.

As implied previously, the embodiments described, and possible alternatives with the same input/output relationship such as a combination of a simple monostable multivibrator and an OR-gate wth an input terminal coupled to one input of the OR-gate directly and to the other input of the OR-gate via the multivibrator, may, for example, be employed as address-change-activated equalization pulse generators in semiconductor memory integrated circuits. Such circuits conventionally comprise a plurality of (possibly multibit) information storage locations which are individually selectable for communication of their stored information to a data output by applying respective binary address words to a parallel address input. Thus such an integrated circuit may be provided with an address bit transition detector circuit corresponding to, and having its input connected to, each bit line of the parallel address input, each such detector circuit being constructed to generate an output pulse of a predetermined duration each time the address bit applied to its input changes. The outputs of these detector circuits may be coupled to, for example, the input 6 of the arrangement of FIG. 1 via respective inputs and the output of an OR, NOR, AND or NAND gate (depending on the polarity of the output pulses of the detector circuits and the sense of transitions at the input 6 to which the arrangement of FIG. 1 corresponds) so that the arrangement of FIG. 12 is triggered to produce an output pulse by an address transition detector output pulse applied to any of the gate inputs, this arrangement output pulse having a minimum duration T and being extended, should a detector output pulse be still present on the expiry of the duration T, to terminate in synchronism with the trailing edge of the last detector output pulse to be present. Another possibility is to provide the arrangement of FIG. 2 with a transistor 1 corresponding to each address-bit transition detector (the number of inputs 6 and inputs to NOR-gate 20 being chosen accordingly), to arrange that each detector output pulse is positive-going, and to connect the output of each detector circuit to the input 6 corresponding thereto. In either case the arrangement output pulses may be used, for example, to render conductive a transistor connected between the two lines of a differential data path from the addressed memory location to the data output of the memory or between a voltage reference point and the single line of a single-ended data path from the addressed location to the data output, so that the potential(s) on this line or lines is/are suitably initialized in response to each change of inputted address. Alternatively or in addition, the arrangement output pulses may be used for other control purposes for the data path, for example for controlling the activation of amplifiers which may be included in this path.

From reading the present disclosure, other modifications will be apparent to persons skilled in the art. Such modifications may involve other features which are already known in the design, manufacture and use of circuit arrangements, semiconductor memories, and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. A pulse generator arrangement which is triggerable to generate an output pulse by a transition of a signal at any of a plurality of inputs thereof from a first to a second logic level, said transition occurring in the absence of said output pulse, the arrangement comprising:

respective first transistors of a first conductivity type corresponding to each input of the plurality of inputs, main conduction channels of the first transistors being coupled in parallel between the arrangement output and a first supply point, each said input being coupled to a control input of its corresponding transistor;

a second transistor of a second conductivity type opposite to the first conductivity type being coupled between the arrangement output and a second supply point;

a signal path being provided from the arrangement output to a control input of said second transistor, for making said second transistor conductive in response to the output pulse and thereby terminating the output pulse, said signal path including delay means for imparting a minimum delay duration T and signal transmission inhibit means; and the arrangement inputs being coupled to said inhibit means for activating said inhibit means in the presence of the second logic level at any of the arrangement inputs.

2. An arrangement as claimed in claim 1, further comprising a hold circuit for holding a current logic level present at the arrangement output when the second transistor and all of said first transistors are nonconductive.

3. An arrangement as claimed in claim 2, wherein the hold circuit comprises a first and second inverter in cascade, the input of the first inverter and the output of the second inverter being coupled to the arrangement output.

4. An arrangement as claimed in claim 3, further comprising disabling means for disabling the hold circuit from holding the current logic level present at the arrangement output when any of the first transistors or the second transistor is conductive to pull the arrangement output to the other level, the output of the inhibit means and the inputs of the arrangement being coupled to said disabling means to control said disabling means.

5. An arrangement as claimed in claim 4, wherein said disabling means comprises a third transistor of the first conductivity type included in a current path through the second inverter from the arrangement output to the first supply point, and a fourth transistor of the second conductivity type included in a current path through the second inverter from the arrangement output to the second supply point, the output of the inhibit means being coupled to the control input of the third transistor and the inputs of the arrangement being coupled to the control input of the fourth transistor.

6. An arrangement as claimed in claim 1, wherein said delay means comprises a parallel combination of a plurality of amplifiers included in said signal path and a parallel combination of a plurality of capacitive elements connected in parallel with said signal path at the outputs of said amplifiers, the connections of the amplifier outputs and the capacitive elements to the node constituted by the common point of said amplifier outputs and said capacitive elements being programmable.

* * * * *